United States Patent
Boerstler et al.

(10) Patent No.: US 6,980,038 B2
(45) Date of Patent: Dec. 27, 2005

(54) CIRCUIT FOR COMPENSATING CHARGE LEAKAGE IN A LOW PASS FILTER CAPACITOR OF PLL SYSTEMS

(75) Inventors: David William Boerstler, Round Rock, TX (US); Eskinder Hailu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/840,561

(22) Filed: May 6, 2004

(65) Prior Publication Data

US 2005/0248412 A1    Nov. 10, 2005

(51) Int. Cl.⁷ .................................................. H03L 7/06
(52) U.S. Cl. ...................................... 327/157; 327/156
(58) Field of Search ............................... 327/156–157, 327/147–148

(56) References Cited

U.S. PATENT DOCUMENTS

| | | |
|---|---|---|
| 4,229,699 A | 10/1980 | Frissell |
| 4,250,411 A | 2/1981 | Kriedt |
| 4,970,405 A | 11/1990 | Hagiwara |
| 5,099,141 A | 3/1992 | Utsunomiya |
| 5,113,862 A | 5/1992 | Mortazavi |
| 5,122,677 A | 6/1992 | Sato |
| 5,155,380 A | 10/1992 | Hwang et al. |
| 5,231,636 A | 7/1993 | Rasmussen |
| 5,315,181 A | 5/1994 | Schowe |
| 5,357,146 A | 10/1994 | Heimann |
| 5,449,999 A | 9/1995 | Edwards |
| 5,489,888 A | 2/1996 | Jagiella et al. |
| 5,729,179 A | 3/1998 | Sumi |
| 5,754,067 A | 5/1998 | Komatsu et al. |
| 5,787,135 A | 7/1998 | Clark |
| 6,157,694 A | 12/2000 | Larsson |
| 6,265,930 B1 | 7/2001 | Walker et al. |
| 6,285,263 B1 | 9/2001 | Anderson |
| 6,388,506 B1 | 5/2002 | Voo |
| 6,396,305 B1 | 5/2002 | Carlson |
| 6,466,096 B1 | 10/2002 | DeVito |
| 6,501,304 B1 | 12/2002 | Boerstler et al. |
| 6,678,132 B1 * | 1/2004 | Carruthers et al. ............ 361/42 |
| 6,696,881 B1 * | 2/2004 | Ho .............................. 327/427 |
| 2005/0035797 A1 * | 2/2005 | Frans et al. .................. 327/156 |
| 2005/0110535 A1 * | 5/2005 | Bernstein et al. ............ 327/156 |

OTHER PUBLICATIONS

Schroder, Deiter K.; "Semiconductor Material and Device Characterization"; John Wiley & Sons, Inc., 1998, p. 391-394.

* cited by examiner

Primary Examiner—Dinh T. Le
(74) Attorney, Agent, or Firm—Carr LLP; Diana R. Gerhardt

(57) ABSTRACT

The present invention provides for a phased locked loop. A capacitor has an associated leakage current. A differential circuit is coupled to the capacitor of a low pass filter. A voltage follower circuit is coupled to the output of the differential circuit. The gate of a field effect transistor (FET) is coupled to an output of the voltage follower circuit. A current mirror is coupled to the FET, the current mirror having a first source and a second source, wherein the second current mirror source is coupled to the drain of the FET, wherein an output of the first current mirror source is coupled to the capacitor. Through the employment of current mirror source, leakage charge within the capacitor is replaced.

28 Claims, 3 Drawing Sheets

CIRCUIT FOR COMPENSATING CHARGE LEAKAGE IN A LOW PASS FILTER CAPACITOR OF PLL SYSTEMS

TECHNICAL FIELD

The invention relates generally to compensating for capacitive leakage and, more particularly, to compensating for capacitive leakage in a phase locked loop circuit

BACKGROUND

Phase Locked Loops (PLLs) can be an integral component of systems that use clocking for various operations. These systems can include microprocessors, wireless/wireline transceivers, and other devices known to those of skill in the art. Generally, PLLs are used to generate an output waveform which has a timing relationship with an input waveform, such as a 1:1 ratio, a 2:1 ratio, and so on. For instance, an input waveform of 60 Hertz could be inputted into a PLL to generate an output waveform of 120 Hertz. Furthermore, there would be a predefined phase relationship between the input wave and the output wave.

One important element of a PLL is a low pass filter, which typically comprises passive elements, such as capacitors and resistors. In a PLL, the voltage on the LPF is used as an input signal to a voltage controlled oscillator (VCO). Therefore, the voltage on the capacitor should remain stable, so that a stable oscillation occurs within the PLL, thereby leading to a stable output frequency.

Often, metal oxide semiconductors (MOSs) can be used as capacitors within a PLL. For instance, the gate and the source, or the gate and the drain, of a MOS can be used within an integrated circuit as the cathode and anode of a capacitor. However, with the rapid advancement of CMOS technology and the resulting reduction in the gate oxide thickness, a regime is being entered wherein the effect of leakage current through the gate dielectric is a problem.

There are two major regimes pertaining to gate leakage in metal-oxide-semiconductor (MOS) devices. These regimes are the "Fowler-Nordheim" regime and the "direct tunneling" regime. In the Fowler-Nordheim tunneling regime, which is dominant for thick (greater the 50 angstrom) oxides, the tunneling is a two-step process. In the first phase, in the presence of a large electric field, carriers at the oxide-semiconductor interface are accelerated. This increases the energy of the carriers (the carriers become 'hot') such that the barrier they encounter is reduced from trapezoidal to triangular. The tunneling current for the Fowler-Nordheim regime is proportional to the below:

$$I \alpha E_{ox}^2 \exp(-B[1-(1-qV_{ox}/C)^{1.5}/E_{ox}])$$

wherein "$E_{ox}$," is the electric field strength across the gate oxide/dielectric, which is dependent on the potential ($V_{ox}$) across the MOS capacitor, and B is a constant.

In the direct tunneling regime, the oxide is thin enough for carriers to directly tunnel across the trapezoidal barrier. The current in the direct tunnel regime is proportional to the following equation:

$$I \alpha E_{ox}^2 \exp(-B[1-(1-qV_{ox}/C)^{1.5}/E_{ox}])$$

wherein $E_{ox}$ is the electric field across the gate oxide/dielectric, q is the electric charge in coulombs, $V_{ox}$ is the voltage across the capacitor dielectric, and B and C are constants. In both of the above equations, the leakage current is exponentially dependent on the voltage across the capacitor.

Generally, the leakage current through the capacitor is exponentially dependent upon the voltage across, as well as the thickness of, the gate dielectric. That is, as the thickness of the gate dielectric gets smaller, the leakage current increases exponentially. Also, increasing the voltage across the capacitor will result in an exponential increase in leakage current.

One trend in device technology is for thinner gate dielectrics to help achieve higher performance. However, the penalty for this is the associated exponential increase in leakage current. In a PLL, the effect of capacitance leakage on PLL performance can be most noticeable when the PLL is in the "locked" state (that is, there is a determined relationship between the input phase and the output phase of the waveforms) and the capacitor is not being charged by either charge pump, what is otherwise referred to as a "high Z" state. Suppose, just before the PLL locks, the voltage at node X 125 in FIG. 1 is set to a voltage value V. Once the PLL is locked, the charge pumps are both disconnected, but for stable operation, the voltage at node X should also remain stable. However, due to gate leakage of the large MOS device which is used as a capacitor, the voltage at node X decays to ground with a time constant that is determined by the effective resistance associated with the tunneling current as well as the value of the capacitance. In some cases, the low pass filter cap is not too leaky. In other words, the time duration over which the discharging takes place is large enough that the resulting jitter will have most of its spectral components within the PLL loop bandwidth. As a result, this jitter is not filtered out.

One conventional solution to minimize this effect is to add a resistor in parallel with the low pass filter capacitor between node X of FIG. 1 and electrical ground. If this added resistor has a value smaller than the effective resistance associated with the tunneling current in the filter capacitor, the resulting jitter at node X will have its spectrum pushed out to higher frequencies. However, the addition of this resistor reduces the effective dominant pole frequency of the PLL, thereby reducing PLL bandwidth. So, one faces the tradeoff of lowered PLL bandwidth with reduced leakage induced jitter.

In the time domain, this resistor can be considered as making the LPF capacitor leakier, thereby pushing the center of the spectral distribution of the jitter at Node X to a higher frequency, which can subsequently be filtered out. However, while long-term jitter is filtered out, the output of the VCO can suffer from substantial cycle-to-cycle jitter.

Therefore, there is a need for an apparatus and a method for compensating for leakage current from a capacitor that addresses at least some of the concerns associated with conventional apparatuses and methods for compensating for current leakage from a capacitor.

SUMMARY OF THE INVENTION

The present invention provides for a phased locked loop. A capacitor has an associated leakage current. A differential circuit is coupled to the capacitor. A voltage follower circuit is coupled to the output of the differential circuit. The gate of a field effect transistor (FET) is coupled to an output of the voltage follower circuit. A current mirror is coupled to the FET, the current mirror having a first source and a second source, wherein the second current mirror source is coupled to the drain of the FET, wherein an output of the first current mirror source is coupled to the capacitor.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
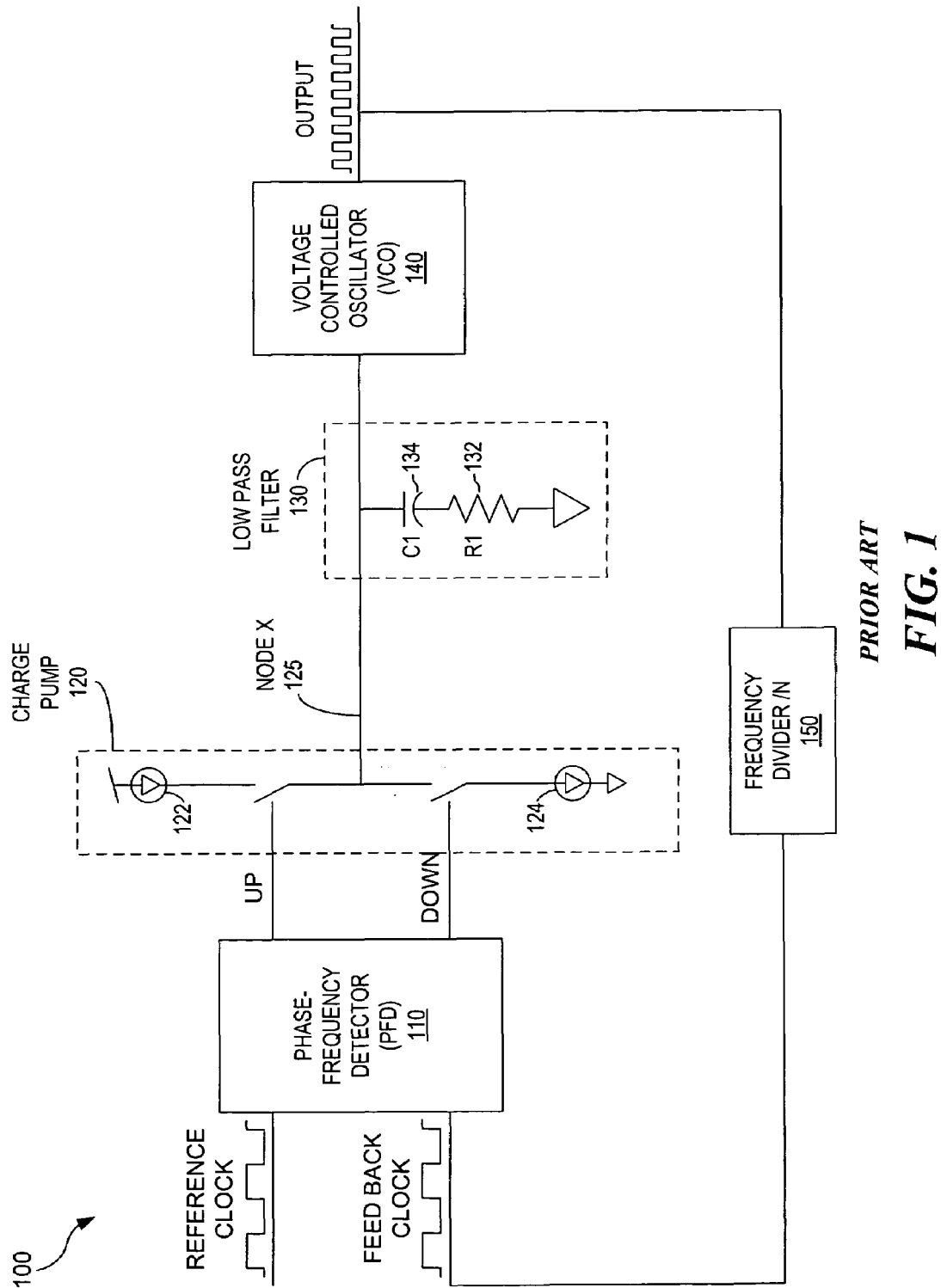
FIG. 1 schematically depicts a conventional phase locked loop.

Turning now to FIG. 1, disclosed is a prior art PLL circuit 100. A phase-frequency detector (PFD) 110 is coupled to a charge pump 120. The charge pump 120 has a current source 122 and current sink 124. The PFD 110 compares the difference between phases of a reference clock frequency and the feedback clock frequency to thereby generate signals to charge the capacitor 134 of the low pass filter 130 through use of the current source 122 or the current sink 124. The voltage on the anode of capacitor 134 is then applied to the voltage controlled oscillator (VCO) 140. The VCO generates an oscillatory output signal at a given frequency as a function of the capacitor 134 voltage. The output of the VCO 140 is then divided in a frequency divider/n 150, and fed back into the PFD 110.

However, should the charge pumps 120 be turned into the "off" condition by the PFD 110, there is no replacement of charge at the capacitor 134, as it continues to drain through a resistor 132. Therefore, there would be "drift" of voltage by the capacitor 134 as charge leaks out of the capacitor 134, which then changes the signal output frequency of the VCO. This changed output is then fed back into the PFD 110, after the frequency divider 150 has processed the changed signal. The PFD 110 would then alter its output to compensate for this change. This drift of output signal of the VCO 140 could lead to an undesirable oscillation of the output frequency signal.

Figure 2:
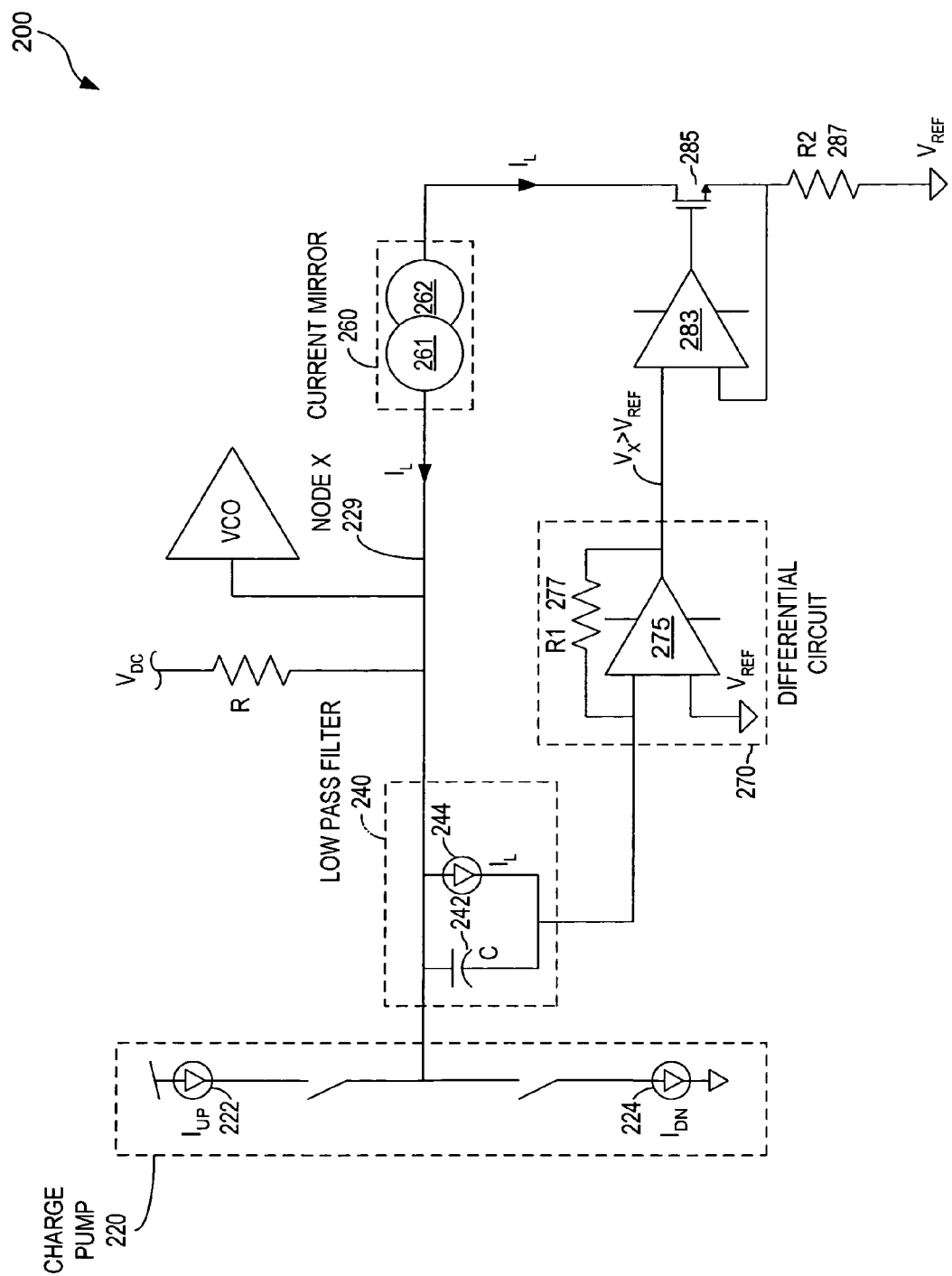
FIG. 2 illustrates a charge compensation circuit that uses a differential circuit with a resistor.

Turning now to FIG. 2, illustrated is a system 200 which employs capacitive current leakage correction, such as is used in a PLL. In the system 200, a phase-frequency detector (PFD) (not shown) is coupled to a charge pump 220. The charge pump 220 has a current source 222 and current sink 224. The PFD compares the difference between phases of a reference clock frequency and the feedback clock frequency to thereby generate signals to charge the capacitor 242 of the low pass filter 240 through use of the current source 222 or the current sink 224. The voltage on the cathode of the low pass filter 240 is then applied to the voltage controlled oscillator (VCO). The VCO generates an oscillatory output signal at a given frequency as a function of the low pass filter 240 voltage.

The low pass filter 240 comprises a capacitor C 242 and its corresponding leakage current $I_L$ 244 coupled to the node x 229. There is a differential circuit (DC) 270 coupled to the output of the C 242. The DC 270 comprises a differential amplifier (DA) 275, and a resistor R1 277 that is coupled across an input and the output of the DA 275. The non-inverting input of the DA 275 is coupled to $V_{ref}$. The output of the differential circuit 270 is coupled to a DA 283. The output of the DA 283 is coupled to the gate of a FET 285. The drain of the FET 285 is coupled to the current source 262 of a current mirror 260, and the source of the FET 285 is coupled to a resistor R2 287. The resistor R2 287 is coupled to $V_{ref}$, which can be, for instance, ground.

The current mirror 260 comprises a first and second current source 261, 262. The ratio of the current between current sources 261 and 262 is typically substantially one-to-one, although the ratio between the current sources 261, 262, can vary in proportion to the proportion of resistance between R1 and R2. In other words, if R2 has ten times greater resistance than R1, then current source 261 conducts ten times the current than is conducted from R2. The current source 260 is coupled to node X 229. The circuit 200 is described for purposes of small signal analysis. Therefore, various biasing currents are not shown for the system 200, but are understood to be present by those of ordinary skill in the art.

In the system 200, the current sources 222, 224 are turned off and on by the PFD as a function of a comparison between the reference clock and a feedback clock signal. The low pass filter 240 comprises a capacitor C 242 with a leakage current $I_L$.

The anode of C 242 is kept at $V_{ref}$, such as ground, by the DA 275. A current flows from the output of 275 counter-clockwise through the R1 277 to the $V_{ref}$. This is true because this analysis is done when analyzing small signals and the biasing current is not shown in FIG. 2. Therefore, the voltage $V_x$ equals $V_{ref}$ plus the resistance R1 times $I_L$. The voltage of $V_x$ is then conveyed by the second DA 283 to the top of R2 287. The voltage across R2 is equal to $\{(V_{ref}+I_L R1)-V_{ref}\}$, which equals $I_L R1$. Therefore, the current through R2 is $I_L R1/R2$. If R1 is equal to R2, then the current through R2 is equal to $I_L$. The current $I_L$ is also driven by the voltage drop across the source of the FET 285. The current $I_L$ is then drawn from the current source 262 of the current mirror 260. The current mirror 260 has a current source 261, which then is also $I_L$. This $I_L$ is then flows into the capacitor C 242 to replace the leakage charge.

In a further embodiment, R1 277 and R2 287 are not substantially identical resistances. However, the current source 261 and 262 are in proportion to one another as well. For instance, if the resistance of R2 287 is ten times larger than the resistance R1 285, the current source 261 will source ten times more current than the current source 262. This ensures that the $I_L$ is properly generated as replacement charge.

Figure 3:
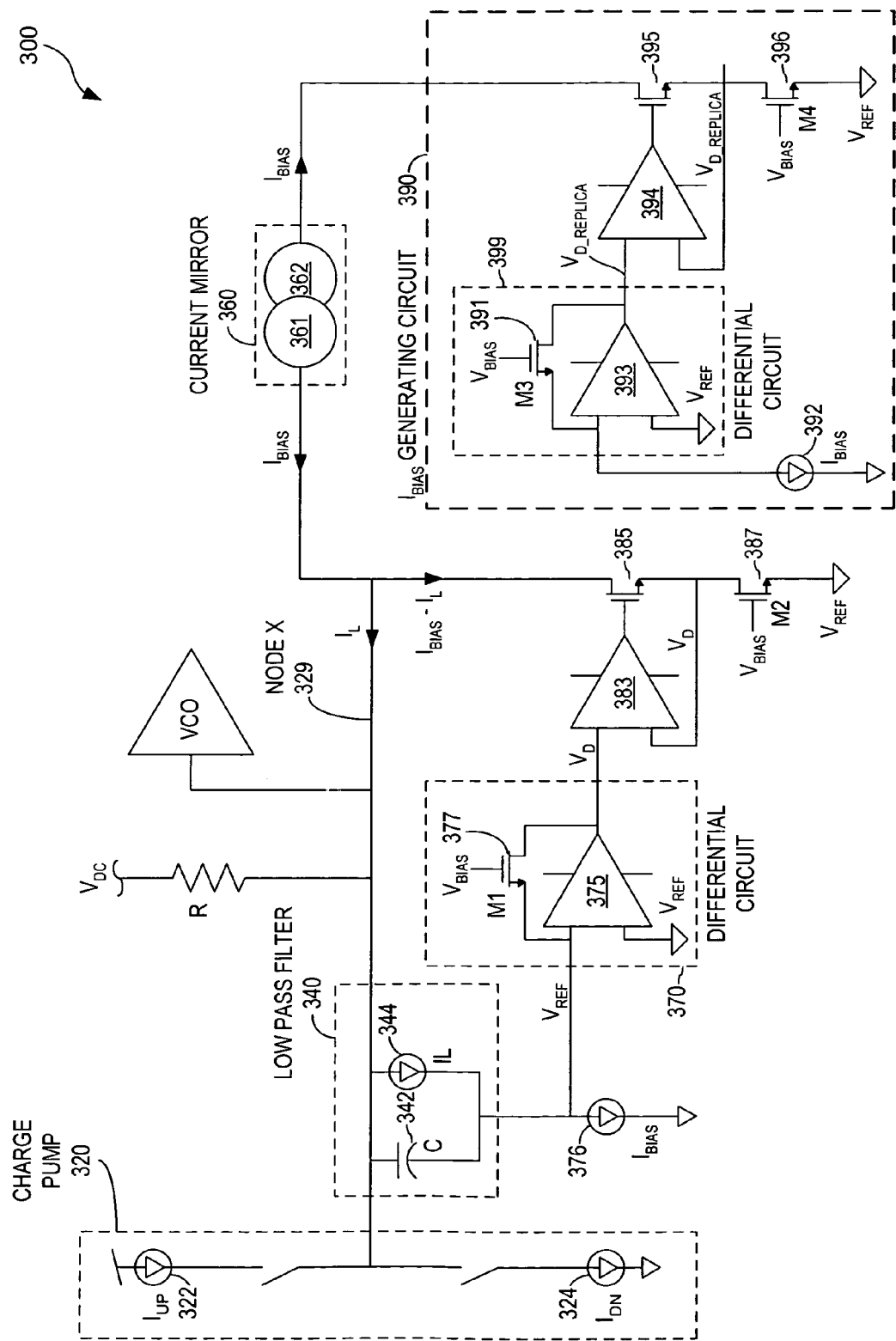
FIG. 3 illustrates a charge compensation circuit that uses a differential circuit with a transistor.

Turning now to FIG. 3, illustrated is a system 300 which employs capacitive current leakage correction, such as is used in a PLL. In the system 300, a PFD (not shown) is coupled to a charge pump 320. The charge pump 320 has a current source 322 and current sink 324. The PFD compares the difference between phases of a reference clock frequency and the feedback clock frequency to thereby generate signals to charge the capacitor 342 of the low pass filter 340 through use of the current source 322 or the current sink 324. The voltage on the anode of the low pass filter 340 is then applied to the VCO. The VCO generates an oscillatory output signal at a given frequency as a function of the low pass filter 340 voltage.

The low pass filter 340 comprises a capacitor 342 and its corresponding leakage current $I_L$ 344 coupled to the node x 329. There is a differential circuit 370 coupled to the output of the C 342. The differential circuit 370 comprises a DA 375 and FET 377. The FET 377 is coupled across an input and the output of the DA 375, and the gate of FET 377 is coupled to Voltage source $V_{bias}$. The output of the differential circuit 370 is coupled to a DA 383. The output of the DA 383 is coupled to the gate of a FET 385. The current through FET 385 is $I_{bias}$ minus $I_L$. The source of the FET 385 is coupled to the drain of a FET 387. The source of the FET 387 is coupled to the voltage level $V_{ref}$, which can be ground. The anode of C 342 is also coupled to a current drain $I_{bias}$ 376. The drain of the FET 385 is also coupled to a current source 361 of a current mirror 360.

The current mirror 360 comprises a first and second current source 361, 362. The ratio of the current between current sources 361 and 362 can be substantially one, although the ratio between the current sources 361, 362, can vary in proportion to the proportion of current sources, as will be described below. The current source 360 is coupled to node X 329. In the system 300, the current sources 322, 324 are turned off and on by the PFD as a function of a comparison between the reference clock and a feedback clock signal. The current from each branch of the current mirror 360 is $I_{bias}$. Therefore, the current going to LPF 340 is $I_L$, which conveys leakage current to compensate for the leakage charge from C 342.

Coupled to the current source 362, there is an $I_{bias}$ generating circuit 390. In the $I_{bias}$ generating circuit 390, there is a differential circuit 399 coupled to an $I_{bias}$ current generator 392. The differential circuit 399 comprises a DA 393 and FET 391. The FET 391 is coupled across an input and the output of the DA 394, and the gate of FET 391 is coupled to Voltage source Vbias. The output of the differential circuit 399 is coupled to a DA 394. The output of the DA 394 is coupled to the gate of a FET 395. The source of the FET 395 is coupled to the drain of a FET 396. The source of the FET 396 is coupled to $V_{ref}$, which can be ground. The drain of the FET 395 is also coupled to a current mirror 360. A number of aspects of the $I_{bias}$ generating circuit 390 are similar to either the differential circuit 370, the differential follower 383, FETs 385, FET M2 387, and so on. In other words, a number of aspects are replicated. This can greatly improve $I_{bias}$ matching between the $I_{bias}$ generating circuit 390 and the differential circuit 370, DA 383, and so on.

The circuit 300 can act substantially as follows. The LPF has a leakage current $I_L$ 344. The gate of the FET M1 377 is coupled to a $V_{bias}$ voltage, which is above $V_{ref}$. The current through FET M1 377 is a current $I_{bias}$, minus the leakage current $I_L$. Even with the leakage current $I_L$ subtracted from $I_{bias}$, $I_{bias}$ minus $I_L$ is still large enough to ensure that the components, such as M1 FET 377, stay biased in their substantially linear response regions. Both the $I_L$ and the "$I_{bias}$ minus $I_L$" currents are drained off by the $I_{bias}$ current sink 376.

Therefore, the voltage at $V_D$ is the voltage gain across M1 377 plus the $V_{ref}$ voltage. The DA 383 applies the same voltage to the drain of FET M2 387 and the source of the FET 385. Also, the $V_{bias}$ voltage applied at FET 387 is substantially the same as is found in FET M1 377. Due to the voltage across M2 387, and if M2 and M1 have the same area or otherwise have the same response curve, the current through FET 385 is also $I_{bias}-I_L$. Therefore, the $I_{bias}$ current comes from the current mirror 360.

Similarly, in the bias current generator circuit 390, $I_{bias}$ is generated externally by using an FET, such as M4 396, biased by an external voltage source. The $I_{bias}$ generating circuit 390, and hence the current mirror 360, is used so that $I_{bias}$ does not end up over-charging the LPF 340. The drain of a FET M3 391 is coupled to a $V_{bias}$ voltage, which is above $V_{ref}$. The current through M3 is a current $I_{bias}$. The $I_{bias}$ current is drained off by the $I_{bias}$ current sink 392.

Therefore, the voltage at $V_{D\_Replica}$ is the voltage gain across M3 391 plus the $V_{ref}$ voltage. The general relation between the sizes of FET 391 and 396, and the current mirrors 361 and 362 is substantially as follows. If FET 391 is "K" times larger than that of FET 396, indicating FET 391 conducts "K" times more current than FET 396, then current mirror 361 is "K" times larger than current mirror 362. In other words, current mirror 361 conducts K times more current than current mirror 362. K is any number greater than zero. The DA 394 has the same voltage applied to the drain of FET M4 396, which is also $V_{D\_Replica}$. Also, the gate voltage at M3 391 is set to $V_{bias}$. Due to the voltage across M4 396, and if M3 and M4 have the same response curve (that is, "K" equals "one"), then the current through FET M4 396 is also $I_{bias}$. Therefore, the $I_{bias}$ current comes from the current mirror 360.

In the circuit 300, the transistors 385, 387, 395, and 396 need not be in a linear region to operate well. The resistances of M1 377 and the M2 387, however, are to be substantially identical. If the source, gate and drain voltages of M1 377 and M2 387 are substantially the same then, regardless of which region they are operating in, the effective resistance they introduce is substantially identical. This can be a beneficial property, because the circuit 300 can function very well under a variety of operating conditions. However, one requirement is that $I_{bias}$ is selected so that, under all operating conditions, $V_D$ is higher voltage than $V_{ref}$.

The circuits 200, 300 have at least two benefits. Extra circuitry is not being used within the PFD or elsewhere within the charge pump 220 to compensate for leakage currents, which is advantageous in that it does not introduce extra noise into the node X, the driver node for the VCO. Secondly, these circuits enable leakage compensation even in processes where the leakage current characteristics are not well modeled.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

What is claimed is:

1. A circuit, comprising:
   a capacitor comprising a cathode and an anode, the capacitor having an associated leakage current;
   a differential circuit coupled to the anode of the capacitor;
   a voltage follower circuit coupled to an output of the differential circuit;
   a field effect transistor (FET), wherein a gate of the FET is coupled to an output of the voltage follower circuit; and
   a current mirror coupled to the FET and the capacitor, the current mirror having a first current source and a second current source, wherein an output of the first current source is coupled to the cathode of the capacitor, and wherein an output of the second current source is coupled to a drain of the FET.

2. The circuit of claim 1, wherein the capacitor is part of a low pass filter of a phase-locked loop.

3. The circuit of claim 1, wherein an input of the differential circuit is coupled to a selected reference voltage.

4. The circuit of claim 3, wherein the selected reference voltage is a ground voltage.

5. The circuit of claim 1, wherein the differential circuit comprises a first resistor coupled between an output and input of a differential amplifier.

6. The circuit of claim 1, wherein a second resistor is coupled between a source of the FET and a selected reference voltage.

7. The circuit of claim 3, wherein the output of the differential circuit has a higher voltage than the selected reference voltage to the differential circuit.

8. The circuit of claim 1, wherein the current from the first current source substantially compensates for the leakage current of the capacitor.

9. The circuit of claim 1, further comprising a charge pump coupled to the capacitor.

10. The circuit of claim 1, further comprising a voltage controlled oscillator coupled to the capacitor.

11. A circuit, comprising:
    a capacitor comprising a cathode and an anode, the capacitor having an associated leakage current;
    a differential circuit coupled to the anode of the capacitor;
    a voltage follower circuit coupled to an output of the differential circuit;
    a first field effect transistor (FET), wherein a gate of the first FET is coupled to an output of the voltage follower circuit;
    a current mirror coupled to the first FET, the current mirror having a first current source and a second current source, wherein the first current source is coupled to a drain of the first FET and to the cathode of the capacitor; and
    a bias current generating circuit coupled to the second current source.

12. The circuit of claim 11, wherein the capacitor is part of a low pass filter of a phase locked loop.

13. The circuit of claim 11, wherein an input of the differential circuit is coupled to a selected reference voltage.

14. The circuit of claim 13, wherein the selected reference voltage is a ground voltage.

15. The circuit of claim 11, wherein the differential circuit comprises a second FET is coupled between an output and an input of a differential amplifier.

16. The circuit of claim 15, wherein the first and second FET have a substantially similar resistance in the presence of a substantially similar current.

17. The circuit of claim 11, wherein a second FET is coupled between the source of the first FET and a selected reference voltage.

18. The circuit of claim 17, wherein the first and second FET have a substantially similar resistance in the presence of a substantially similar current.

19. The circuit of claim 11, wherein an output voltage of the differential circuit is higher than an input reference voltage to the differential circuit.

20. The circuit of claim 11, wherein an output current of the first current source substantially compensates for the leakage current of the capacitor.

21. The circuit of claim 11, further comprising a charge pump coupled to the capacitor.

22. The circuit of claim 11, further comprising a voltage controlled oscillator coupled to the capacitor.

23. The circuit of claim 11, wherein the bias current generating circuit comprises a second FET and wherein the first FET and the second FET have substantially the same resistance for a selected current.

24. A method for compensating for leakage current in a capacitor, comprising:
    receiving, by a differential circuit, a capacitor anode voltage from an anode of a capacitor comprising a cathode and an anode and having a leakage current;
    tying the capacitor anode voltage to a reference voltage;
    differentially amplifying, by the differential circuit, the capacitor anode voltage to exceed the reference voltage, thereby generating an amplified voltage;
    conveying the amplified voltage to a gate of a first FET and to a first resistive element;
    generating a first mirror current in response to the amplified voltage conveyed to the gate of the first FET;
    generating a second mirror current in response to the first mirror current; and
    conveying the second mirror current to the capacitor to compensate for the leakage current.

25. The method of claim 24, wherein the capacitor is part of a low pass filter of a phase-locked loop.

26. The method of claim 24, wherein the selected reference voltage is a ground voltage.

27. The method of claim 24, wherein the second mirror current is a multiple of the first mirror current.

28. The method of claim 27, wherein the second mirror current is a multiple of the first mirror current in proportion to a first resistance of the differential circuit and a second resistance of the first resistive element.

* * * * *